(12) United States Patent
Murray et al.

(10) Patent No.: US 10,039,191 B2
(45) Date of Patent: Jul. 31, 2018

(54) ELECTRICAL POWER CONVERSION SYSTEM

(71) Applicants: David Russell Murray, Manly (AU); Brett Watson, Helensvale (AU)

(72) Inventors: David Russell Murray, Manly (AU); Brett Watson, Helensvale (AU)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/320,880

(22) PCT Filed: Jul. 13, 2015

(86) PCT No.: PCT/IB2015/055275
§ 371 (c)(1),
(2) Date: Dec. 21, 2016

(87) PCT Pub. No.: WO2016/012899
PCT Pub. Date: Jan. 28, 2016

(65) Prior Publication Data
US 2017/0202087 A1 Jul. 13, 2017

(30) Foreign Application Priority Data
Jul. 24, 2014 (AU) .................. 2014206162

(51) Int. Cl.
*H02M 3/335* (2006.01)
*H05K 1/18* (2006.01)
(Continued)

(52) U.S. Cl.
CPC ........ *H05K 1/181* (2013.01); *H02M 3/33546* (2013.01); *H02M 7/003* (2013.01);
(Continued)

(58) Field of Classification Search
CPC ......... H02M 3/33507; H02M 3/33546; H02M 3/33569; H02M 3/3376; H02M 3/3384; H02M 7/003; H02M 7/06; H02M 7/537; H02M 7/538; H02M 7/5381; H02M 7/5387; Y02B 70/126; Y02B 70/1433; Y02B 70/1441; Y02B 70/1475; H05K 1/0254; H05K 1/181; H05K 2201/10015; H05K 2201/10022
USPC .......... 363/16, 17, 21.01, 126, 131, 132, 140
See application file for complete search history.

(56) References Cited

U.S. PATENT DOCUMENTS 4,408,269 A 10/1983 Nowaczyk
7,304,872 B1 * 12/2007 Yakymyshyn .......... H02M 5/06
307/140
(Continued)

FOREIGN PATENT DOCUMENTS

GB 2175463 A 11/1986

OTHER PUBLICATIONS

International Search Report PCT/ISA/210 for International Application No. PCT/IB2015/055275 dated Oct. 13, 2015.
(Continued)

*Primary Examiner* — Yemane Mehari
(74) *Attorney, Agent, or Firm* — Harness, Dickey & Pierce, P.L.C.

(57) ABSTRACT

An electrical power conversion system for converting a high voltage from a HV electrical power supply to a low voltage is disclosed. In an embodiment, the electrical power conversion system includes at least one power converter and at least one RC network including a plurality of resistive components and a plurality of capacitive components electrically connected in series. In an embodiment, the at least one RC network is in series connection with the at least one power converter and the at least one RC network and at least one power converter are arranged to be connected across a line potential of the HV electrical power supply.

18 Claims, 7 Drawing Sheets

(51) Int. Cl.
*H02M 7/00* (2006.01)
*H02M 7/06* (2006.01)
*H05K 1/02* (2006.01)

(52) U.S. Cl.
CPC ............ *H02M 7/06* (2013.01); *H05K 1/0254* (2013.01); *H05K 2201/10015* (2013.01); *H05K 2201/10022* (2013.01)

(56) References Cited

U.S. PATENT DOCUMENTS

| | | | |
|---|---|---|---|
| 8,233,301 B1* | 7/2012 | Guo | H02M 7/217 363/125 |
| 2013/0329463 A1* | 12/2013 | Chen | H02M 1/4258 363/17 |
| 2014/0016359 A1* | 1/2014 | Telefus | H02M 3/335 363/16 |
| 2014/0071714 A1* | 3/2014 | Li | H02M 3/33507 363/16 |
| 2014/0313786 A1* | 10/2014 | Chen | H02M 1/4266 363/21.01 |

OTHER PUBLICATIONS

Written Opinion of the International Searching Authority PCT/ISA/237 for International Application No. PCT/IB2015/055275 dated Oct. 13, 2015.
International Preliminary Report on Patentability dated Jan. 24, 2017.

* cited by examiner

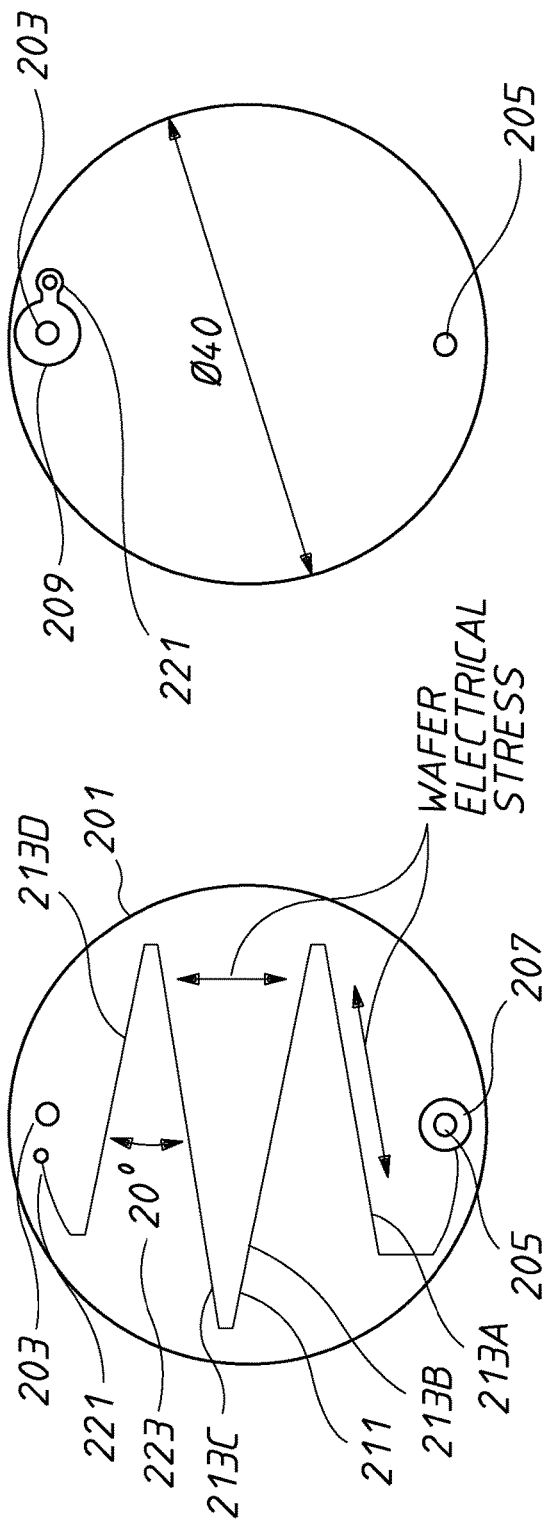
FIG.2A
FIG.2B
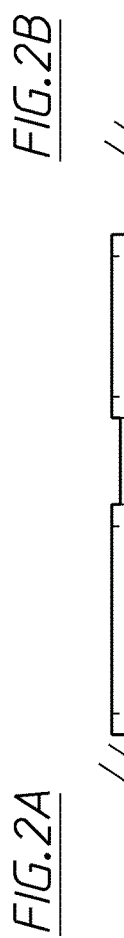
FIG.2C

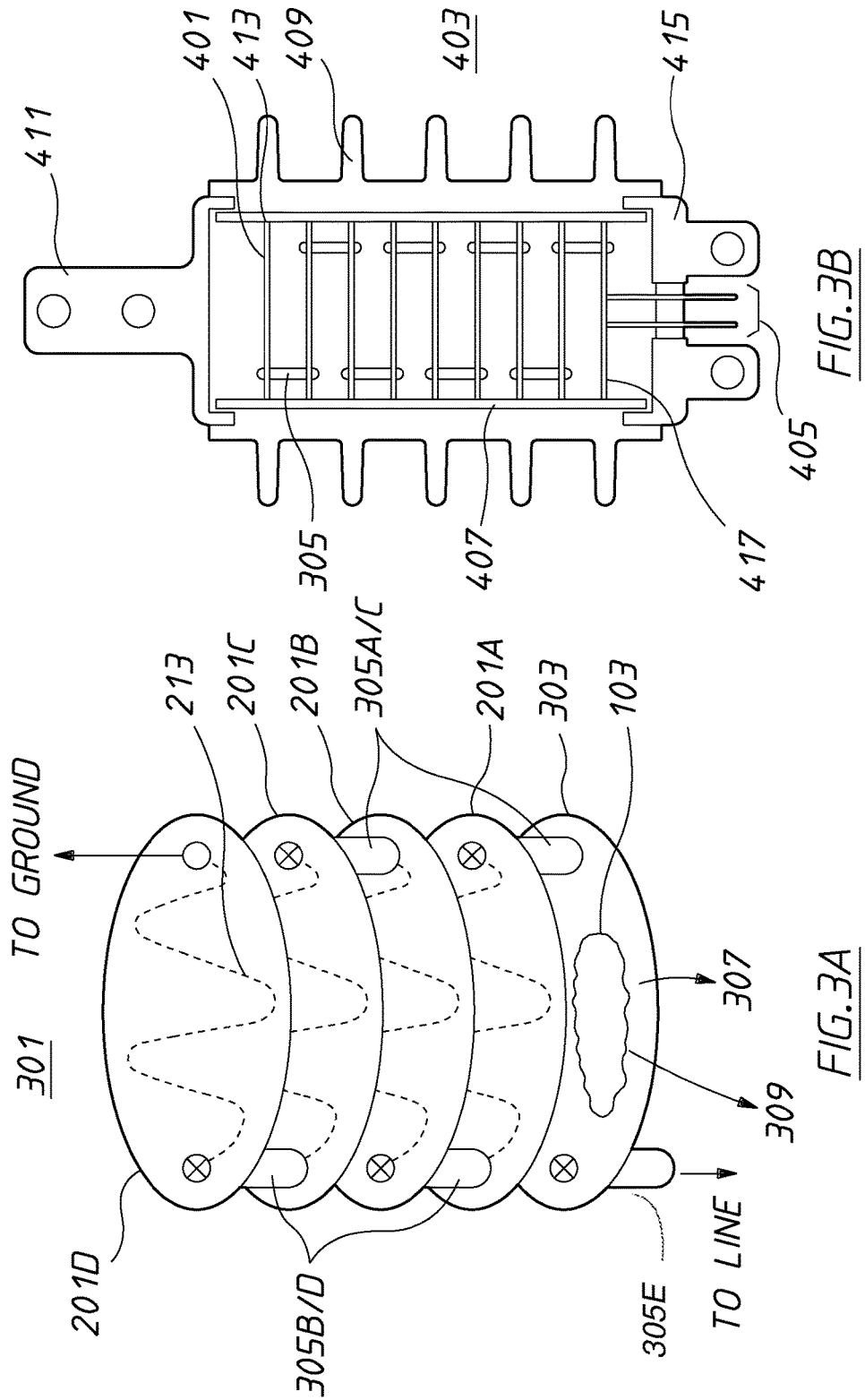

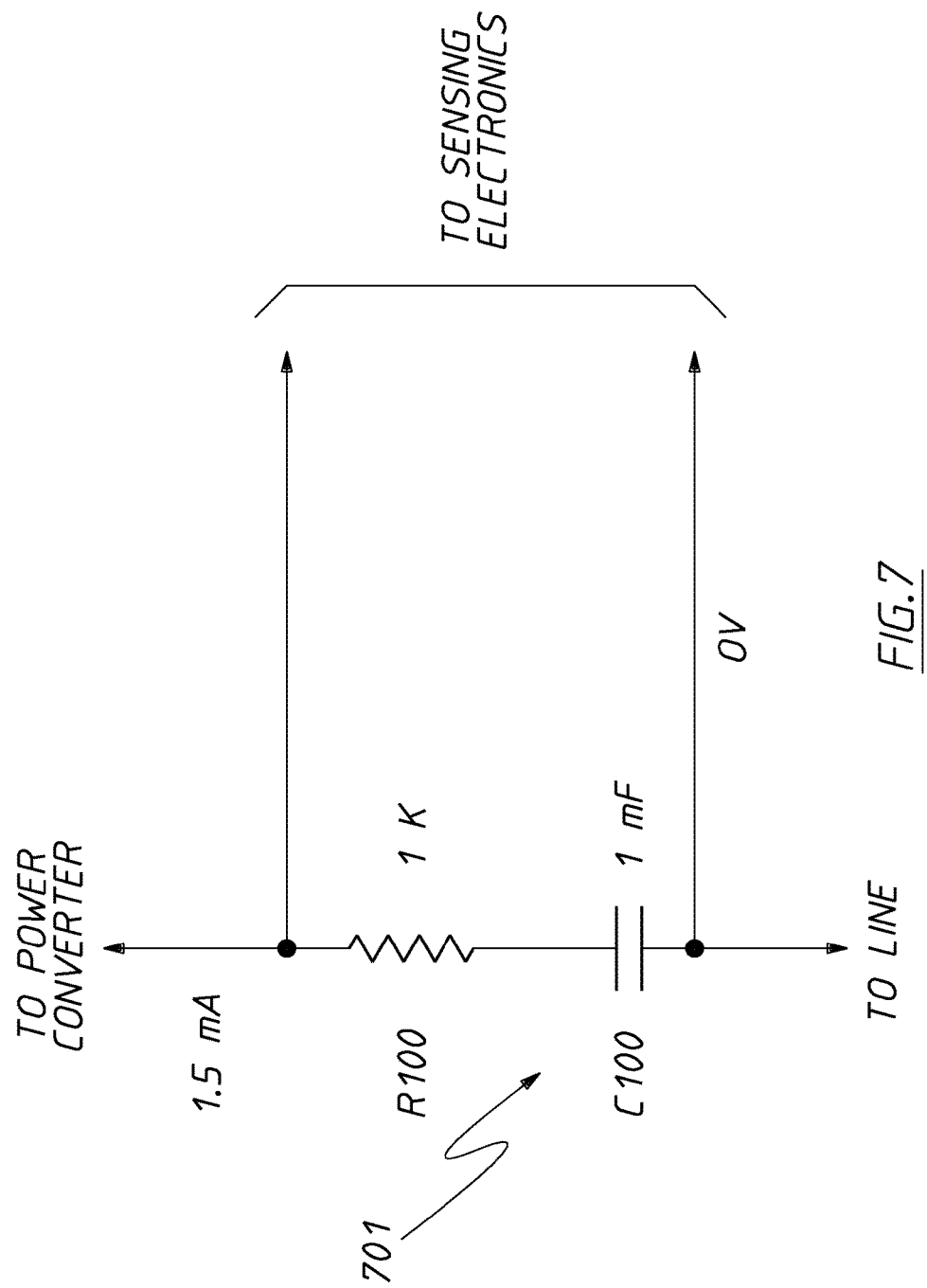

ELECTRICAL POWER CONVERSION SYSTEM

PRIORITY STATEMENT

This application is the national phase under 35 U.S.C. § 371 of PCT International Application No. PCT/IB2015/055275 which has an International filing date of Jul. 13, 2015, which designated the United States of America and which claims priority to Australian patent application number AU 2014206162 filed Jul. 24, 2014, the entire contents of which are hereby incorporated herein by reference.

FIELD

At least one embodiment of the present invention relates generally to an electrical power conversion system.

BACKGROUND

In various electrical networks there are increasing opportunities to use load electronic systems to provide improved protection, automation and communication products for use with those electrical networks. It therefore becomes necessary to provide a suitable power supply for use by the load electronic systems.

In locations where a low voltage (LV) power supply is not available, or in applications where the electronic systems are preferably floated at high voltage (HV) line potential, there may be a prohibitive cost or space barriers in providing a power supply drawing its power from the HV line itself. The problem of providing power to load electronic systems is becoming more acute as the applications for load electronic systems expand.

As power requirements for load electronic systems are diminishing each year with the introduction of new semiconductor and communications technologies, an opportunity is provided for the provision of limited power from the line voltage of HV power supplies at low cost.

Voltage power supplies utilizing HV electrical networks have to overcome several problems.

One such problem is that HV electrical networks need to withstand high electrical stresses due to the high system voltage being applied. These therefore require appropriate insulation systems with due regard to surface tracking, material breakdown, partial discharge and so on. There are standard production tests that may be used to monitor electrical stress, such as, for example, power frequency (PF) tests and partial discharge tests.

Further, these electrical networks need to withstand high over-voltage impulses which may occur in electrical networks. These are usually caused by lightning or connected switching devices and can be 100 kV or more on electrical networks. There are standard design tests that may be used to monitor for this condition, such as, for example, lightning impulse tests etc.

Also, the consequences of insulation failure are usually catastrophic and can result in explosions because of the high voltages and high energies involved. This can lead to a significant design effort in order to limit the consequences of failure. Also, this can result in over-design, which can further result in increased product cost.

Overcoming these problems can therefore lead to large, heavy and expensive solutions with high installation costs to the utility.

It is known to derive power from the line connection on a HV network to operate remote equipment, such as a recloser for example, where the power is obtained via a wound voltage transformer (VT). This has been considered necessary for the high power requirement of the controllers (approximately 20-50 W) which operate at ground potential.

However, design and construction of a wound VT is complex and costly. Also, reducing the power requirements for the wound VT does not reduce the cost in proportion. For example, a 200 mW VT is not one thousandth of the cost of a 200 W VT.

A wound VT is a well-established solution that comes at high installation and purchase installation cost. Moreover for certain products, such as the Fusesaver product offered by Siemens, or indeed other equipment running at line potential, the requirement would be for multiple VT's or a special purpose design with multiple isolated secondary windings in order to supply the electronics that are at line potential on each phase. This therefore increases costs further.

Although the wound VT may be a good solution for applications requiring several watts of power, it is not considered a good solution for use with applications requiring less than one watt of power. These may include, for example, applications such as capacitor bank switches and reclosers operating at line potential, as well as fault indicators and line quality monitors etc.

High voltage ceramic capacitors have been used previously for low power controllers. According to this method, the HV line is fed through the capacitor to a grounded power transformer (VT) with a primary voltage that is much lower than the line voltage. In theory, the cost of lower voltage transformer is much lower than that of a high voltage transformer.

Special purpose capacitors have also been developed for high voltage electrical systems for this purpose. Although they are cheaper than a wound VT, they still require insulation systems to be engineered. Further, these special purpose capacitors may suffer from significant problems. For example, these special purpose capacitors may not withstand lightning impulse voltages of the required magnitude. Further, on impulse they may offer low impedance to the wave front and hence apply a high or very high voltage surge to the transformer which means the transformer design is complex and/or additional protection components must be incorporated.

These fundamental problems make use of these special purpose capacitors in conjunction with a transformer very problematic and so are not considered a viable solution to the problem.

It may also be possible to use an inductor in series with a transformer to limit the current at line voltage. This has the advantage of limiting the voltage applied to the transformer during impulse, as the impulse voltage is withstood across the inductor. However, the design and construction of the inductor is almost as complex as the design for a VT, where they have to solve the problem of withstanding full impulse voltage across a wound inductor.

Therefore, series inductors are not considered a viable solution to the problem.

Another possible solution would be to use a resistor in series with the transformer as this is much easier to design from the perspective of withstanding a high impulse voltage.

However, the resistor power dissipation will usually be high at normal line voltages. For example, for a 22 kV line with a 1 mA resistor current, a dissipation of 13 W is required which can result in significant heating.

When performing a PF test, power dissipation may increase further. For example, 13 W power dissipation may become 200 W during a 50 kV PF test, which may be impossible to manage. Furthermore, if a higher primary current is required (e.g. 2 mA) then these power dissipations may double again.

Therefore, a series resistor in conjunction with a transformer is not considered a viable solution to the problem.

SUMMARY

Disclosed are embodiments which seek to address the above problems by limiting the current drawn at power frequencies, limiting the current drawn in impulse conditions and withstanding impulse voltages. The herein described arrangements provide a low cost, compact solution which may be built into equipment with the consequence of little or no installation cost to the utility.

According to a first embodiment of the present disclosure, there is provided an electrical power conversion system for converting a high voltage (HV) from a HV electrical power supply to a low voltage, wherein the electrical power conversion system comprises: at least one power converter, and at least one RC network comprising a plurality of resistive components and a plurality of capacitive components electrically connected in series, wherein the at least one RC network is in series connection with the at least one power converter, and the at least one RC network and at least one power converter are arranged to be connected across a line potential of the HV electrical power supply.

Other embodiments of the invention are also disclosed.

BRIEF DESCRIPTION OF THE DRAWINGS

FIG. 2A shows a component side view of an electronic circuit board according to the present disclosure;

FIG. 2B shows a bottom side view of an electronic circuit board according to the present disclosure;

FIG. 2C shows a surface mount view of a resistor and capacitor pair according to the present disclosure;

FIG. 3A is a stack of electrically interconnected electronic circuit boards according to the present disclosure;

FIG. 3B is a cross sectional view of an RC network stack in a housing according to the present disclosure;

FIG. 7 shows a schematic diagram of a voltage sensor according to the present disclosure.

DETAILED DESCRIPTION OF THE EXAMPLE EMBODIMENTS

Figure 1:
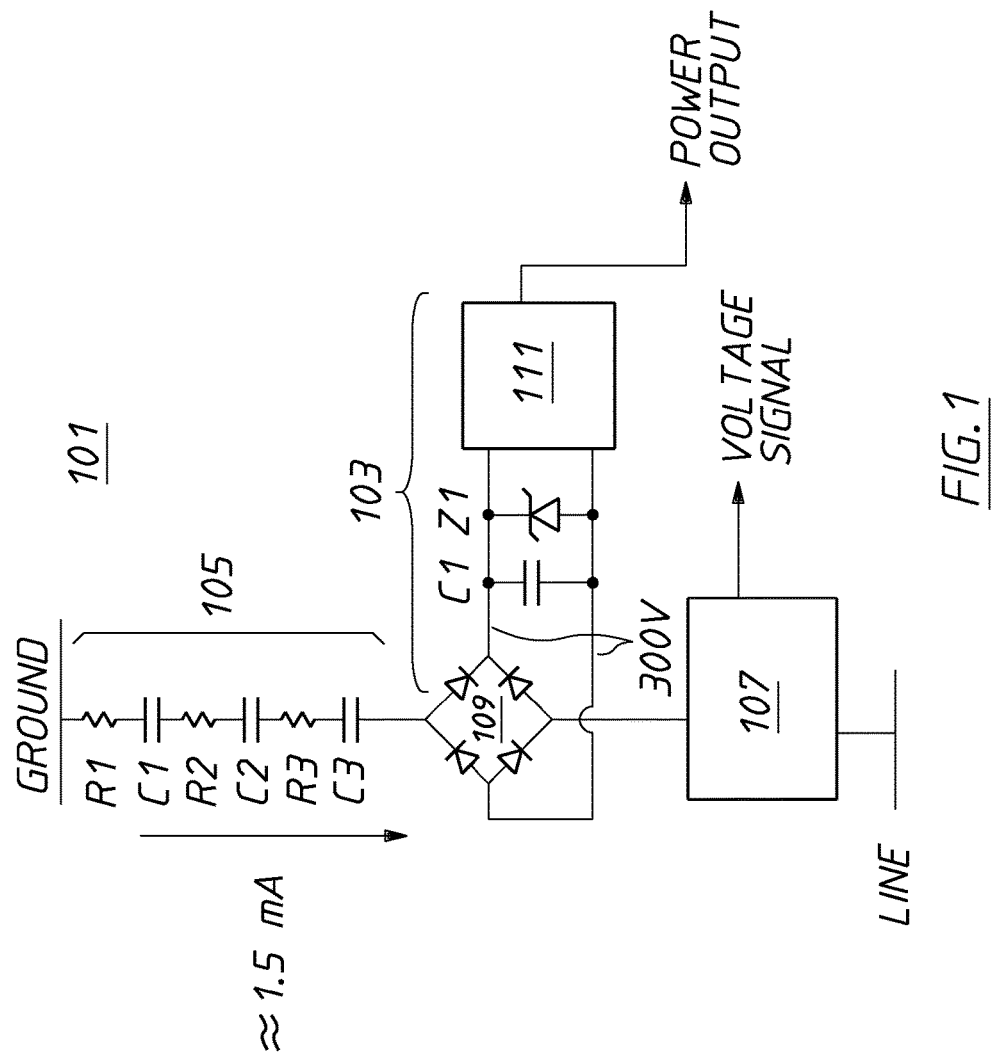
FIG. 1 is a schematic diagram of an electrical power conversion system according to the present disclosure.

Where reference is made in any one or more of the accompanying drawings to steps and/or features, which have the same reference numerals, those steps and/or features have for the purposes of this description the same function(s) or operation(s), unless the contrary intention appears.

It is to be noted that the discussions contained in the "Background" section and that above relating to prior art arrangements relate to discussions of documents or devices which form public knowledge through their respective publication and/or use. Such should not be interpreted as a representation by the present inventor(s) or the patent applicant that such documents or devices in any way form part of the common general knowledge in the art.

It will be understood that the power conversion system described herein may be suitable for a number of different types of applications and products, such as any situation requiring low electrical power at low voltage where there is not a pre-existing low voltage power supply but there is a pre-existing HV power supply. The power conversion system may be used with capacitor bank switches, fault indicators, intelligent circuit breakers, reclosers etc. It may also be used in power switching systems, such as HV switching devices, which are particular suited for receiving power from the power conversion system as herein described. Other examples of suitable systems include remote monitoring or control or protection equipment which fit the above situation.

FIG. 1 is a schematic diagram of an electrical power conversion system 101 for converting a high voltage from a high voltage (HV) electrical power supply to a low voltage.

It will be understood that the term low voltage relates to a power source at suitable voltage for the application so the application does not have to solve insulation and power conversion problems. Typically the application is operating electronic systems at extra low voltage, commonly 3-30 VDC. However other applications might require, for example, 230 VAC which will require a different design of power converter. Other elements of the power conversion system would not necessarily change, including the RC network as described herein.

It will be understood that the term HV relates to AC voltages between 1 kV and 38 kV. As an alternative, HV may relate to AC voltages between 5 kV and 38 kV. As a further alternative, HV may relate to AC voltages between 5 kV and 35 kV. As a further alternative, HV may relate to AC voltages between 1 kV and 35 kV. As yet a further alternative, it will be understood that the term HV may relate to AC voltages above 35 kV. As yet a further alternative, HV may relate to AC voltages above 38 kV.

The electrical power conversion system described herein has a power converter 103 for converting the high voltage from the HV system to provide a low voltage electrical power supply, and at least one RC network 105 connected in series with the power converter to provide a current source.

The RC network 105 has a plurality of (i.e. two or more) resistive components and a plurality of (i.e. two or more) capacitive components, where the resistive components and capacitive components are electrically connected in series.

According to the example shown in FIG. 1, there are three resistive components (resistors) R1, R2 and R3 and three capacitive components (capacitors) C1, C2 and C3, where the resistors and capacitors are connected in a series chain and are alternated. That is, no two resistors are directly connected together and no two capacitors are directly connected together. This arrangement distributes the electric field along the length of the chain and so enables the insulation system to be managed much more easily.

It will be understood that, as an alternative, two or more capacitors may be directly connected together, and two or more resistors may be directly connected together. For example, all resistors may be connected together in series at one end of the RC network and all capacitors may be connected in series at the other end of the RC network.

Further, according to this example, R1 is connected between a ground connection and C1, C1 is connected between R1 and R2, R2 is connected between C1 and C2, C2 is connected between R2 and R3, R3 is connected between C2 and C3, and C3 is connected between R3 and the power converter 103. The power converter 103 is connected between the line connection of the HV network and the RC network 105.

According to this example, a voltage sense module 107 is also provided and is connected between the line connection of the HV network and the power converter 103. The voltage sense module 107 is discussed in more detail below with reference to FIG. 7.

Therefore, the RC network 105 is arranged for connection between the HV electrical power supply and the power converter 103. This arrangement may limit the current drawn from the HV electrical power supply in order to generate a low voltage electrical power supply for providing power to power switching systems.

The capacitors in the RC network 105 limit the current at power frequency (PF) and ensure that the power dissipation in the resistors is low and the resistors are not stressed beyond their power and voltage ratings. The resistors limit the current during impulse conditions and withstand the impulse voltage so that the capacitors and the power converter are not stressed beyond their ratings.

The values of the RC network are arranged to provide the current and voltage required for the power converter. In this example the current drawn from the power line is limited to approximately 1.5 mA at nominal voltage. Although it is possible to draw significantly more current than this, the associated component costs may rise.

The power converter 103 has a rectifier 109 for rectifying the current. This rectified current is used to charge a capacitor C1 to a voltage of approximately 300V, which is limited by a Zener diode Z1. This arrangement provides 450 mW of available power (300V×1.5 mA) and is used to supply a switching DC-DC power converter module 111, which converts the 300V down to the required supply for the load electronics. A typical voltage supply for the load electronics would be around 6V.

Alternatively a DC-AC switching power converter can be provided if there is a requirement to do so. Also, as a further alternative, rectifier 109 can be omitted and an AC-DC or AC-AC power converter provided. It will be understood that any other suitable voltage supply may be provided by the power converter module 111 depending on the requirements of the load electronics connected to the power converter 103.

Consideration of the physical implementation of the various components of the electrical power conversion system is important from a cost and reliability standpoint.

For example, the arrangement of multiple resistors and multiple capacitors to form an RC network in a chain spreads the electrical stress and allows design of a predictable and controlled electrical stress insulation system.

According to this embodiment, the resistors and capacitors are surface mount technology (SMT) components that are machine assembled on small printed circuit boards (PCBs), referred to as wafers. The use of SMT components in this manner reduces cost and enables a pre-determined number of multiple wafers to be arranged with respect to each other in order to control electrical stresses.

After the wafers have been manufactured to create an arrangement of SMT resistors and capacitors thereon, the wafers are assembled into a stack. The wafers are then interconnected in a zigzag fashion to form an RC network chain. That is, a left hand side of a first wafer is connected to the right hand side of a second wafer, where the first and second wafers are at different levels in the stack. The arrangement of stacked wafers assists with the control of electrical stresses and also with keeping cost of assembly low. Other arrangements of RC chain on the wafer are possible and other arrangements for interconnection of wafers are possible.

According to an alternative, the SMT resistive and capacitive components may be mounted on a flexible printed circuit board in a zig-zag arrangement and the printed circuit boards may be rolled up into a tube. This provides a different form factor which may be more suitable to some applications.

The number of wafers in the stack may be adjusted to accommodate different line voltages of the HV network. For example, a single wafer may be used, or alternatively a stack of wafers including two or more wafers may be used. Therefore, a standard wafer component can be used to accommodate the various voltage and power requirements of different HV networks.

FIG. 2A shows a component side view of an electronic circuit board (wafer) 201. FIG. 2B shows a bottom side view of the electronic circuit board. FIG. 2C shows a surface mount view of a resistor and capacitor pair.

According to this embodiment, the wafer is approximately 40 mm in diameter. It will be understood that other suitable diameter wafers may be used as an alternative.

A first hole 203 is formed around the periphery of the wafer 201. The first hole passes from a first side of the wafer through to a second opposing side of the wafer. The first side of the wafer has an upper surface upon which the SMT components are mounted.

A second diametrically opposing hole 205 is also formed around the periphery of the wafer 201. A first electrically conductive pad 207 is positioned on a first side of the wafer 201 around the second hole 205. The electrically conductive pad 207 is to provide a suitable electrical connection to an adjacent wafer in a stack of wafers, as explained in more detail with reference to FIG. 3 below.

A second electrically conductive pad 209 is positioned on a second side of the wafer 201 around the first hole 203 to provide an electrical connection to other wafers in the stack.

According to this embodiment, each of the first and second holes is 4.1 mm in diameter. It will be understood that other suitable diameter holes may be formed through the wafer as an alternative.

The RC network of surface mounted resistors and capacitors is arranged on the surface of the wafer 201 as indicated by the line 211 between the pad 209 and pad 207.

According to this example, the RC network chain on each wafer is approximately 132 mm in length and has multiple individual straight sections (213A, 213B, 213C and 213D) that are connected together and that traverse side to side across the wafer's upper surface to create an RC network with a suitable length and with controlled voltage stress between each traverse. That is, each section (213A, 213B, 213C and 213D) is made up of multiple pairs of an SMT resistor 215 and SMT capacitor 217 connected together via an electrical pad 219 as shown in FIG. 2C. The resistor and capacitor are separated from each other by a distance of approximately 1 mm.

At the end of the RC network chain, a plated through hole (PTH) electrically connects the RC network to the second electrically conductive pad 209 located on the reverse side of the wafer.

It will be understood that different configurations of RC networks may be arranged on the surface of the wafer. For example, the RC network may traverse side to side across the wafer's upper surface to create an RC network with a length that is greater than two, three, four or five times the diameter of the upper surface. This will depend on the angle between each individual transverse straight section of the RC network.

The chosen chain angle 223 between each of the straight sections of the RC network defines the electrical stress placed on the wafer. According to this example, the chain angle has been selected to be 20 degrees. It will be understood that, as an alternative, the chain angle may be between 15 degrees and 25 degrees. As a further alternative, the chain angle may be between 10 degrees and 30 degrees. As further alternatives, the chain angle may be greater than 20 degrees, greater than 25 degrees, greater than 30 degrees, greater than 35 degrees, greater than 40 degrees or greater than 45 degrees.

Therefore, the electrical power conversion system as described herein has resistive components that are surface mounted resistive components and capacitive components that are surface mounted capacitive components. The surface mounted resistive components and the surface mounted capacitive components are mounted on a single side of one or more electronic circuit boards (wafers) forming the RC network. Alternatively the resistive and capacitive components may be mounted on both sides of the wafer.

FIG. 3A shows a stack 301 of electrically interconnected electronic circuit boards or wafers (201A, 201 B, 201C, 201 D). Each of the wafers (201 A, 201 B, 201C, 201 D) is as described above with reference to FIG. 2A, FIG. 2B and FIG. 2C. An additional wafer 303 is provided which has the power converter and a voltage sense module (if required) located thereon.

A single wafer interconnector (305A, 305B, 305C, 305D) is provided between each wafer to provide an electrical connection between the wafers. On the additional wafer 303 a further wafer interconnector 305E connects the additional wafer to the line connection of the HV network. Therefore, the PTH of the additional wafer connects the line connection of the HV network to the voltage sense module (if required) and the power conversion system. The output of the power conversion system (via the power converter) to the load electronics is provided by way of a further electrical connection 307. The output of the voltage sense module to the load electronics is provided by way of a second further electrical connection 309.

The upper wafer 201 D of the stack of wafers is connected to the ground connection of the HV network.

Therefore, the electrical power conversion system as described herein has surface mounted resistive components and surface mounted capacitive components that are mounted on a plurality of electronic circuit boards forming a plurality of RC networks. There is one RC network on each electronic circuit board. The electronic circuit boards are stacked and electrically interconnected forming a stacked RC network. Further, the power converter may be mounted on a further electronic circuit board, where the further electronic circuit board forms part of the plurality of electronic circuit boards that are stacked.

The stack of wafers may be assembled into an electrically insulated tube that has electrical terminals at opposing ends. The electrically insulated tube has suitable insulation properties for the desired electrical application. One such example of an electrically insulated tube could be the type of tube used to house an outdoor surge arrestor.

FIG. 3B shows a cross-sectional view of an RC network stack 401 in a housing 403. FIG. 3B shows how the stack may be assembled within a "surge arrestor" housing. At the bottom of the housing are connections 405 to taking the low voltage power supply and the voltage measurement signal to a product from Siemens called a Fusesaver.

Fusesaver is a new class of intelligent, compact and low cost single phase circuit breaker that minimizes lost customer minutes by protecting lateral line (spur line or T-off) fuses from blowing on transient faults. With on-board microprocessor control and wireless connectivity, Fusesaver has configurable protection, multi-phase operation functions, on-board event history and can be integrated into a SCADA system for remote control.

The Siemens Fusesaver product which can be powered from the line current obtained from HV networks. However, it would be advantageous if the Fusesaver was powered from line voltage. It will be understood that, although the principles described herein relate to the Fusesaver product, the principles may be applicable generally to other types of products and applications.

The wafer stack 401 with wafers interconnected via interconnectors 305 is located within a cylindrical insulated housing tube 407. A silicone overmoulding 409 is fabricated and positioned so that it is located around the outer surface of the housing tube 407.

A first conductive end cap 411 is positioned at a first end of the housing tube 407 and connects the upper wafer 413 of the wafer stack to the ground line of the HV network. That is, the first conductive end cap 411 provides an electrical connection between one end of the RC network located on the upper wafer 413 and the ground line.

A second conductive end cap 415 is positioned at a second end of the housing tube 407 and connects the lower wafer 417 of the wafer stack to the Fusesaver body. That is, the second conductive end cap 415 provides an electrical connection between the power converter (with or without the voltage sense module) located on the lower wafer 417 and the Fusesaver body, where the Fusesaver body is in direct connection with the line connection of the HV network (see FIG. 4).

Figure 4:
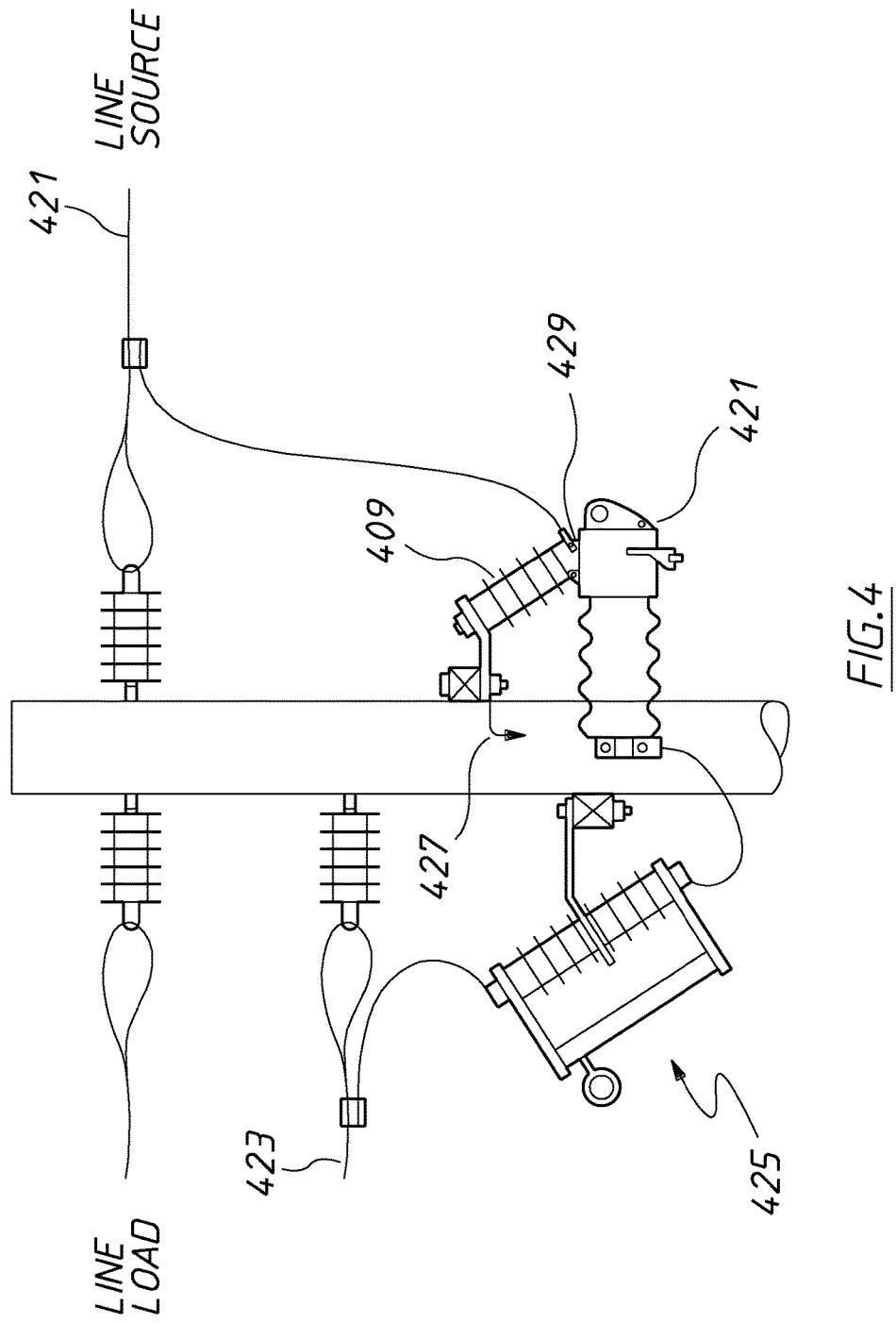
FIG. 4 is a view of the device in FIG. 2B connected to a fuse saver device according to the present disclosure.

FIG. 4 shows a view of the device described above with reference to FIG. 3B connected to the body of a Fusesaver device. FIG. 4 shows how the electrical power conversion system 409 constructed as above in the form of a stacked RC network in an insulated tube could be mounted onto a Siemens Fusesaver product 421, which is installed on an electrical spur line 423 with a fuse 425. The upper end of the electrical power conversion system (i.e. the RC network) is connected to ground 427 of the HV network. The lower end of the electrical power conversion system (i.e. the power converter) is connected to the Fusesaver body 429 which is at line potential as it is connected to the main line source 421 of the HV network. The power supply output from the switched mode DC-DC power converter and the voltage measurement signal from the voltage sense module are not visible as they are connected internally within the Fusesaver product.

It will be understood that many other suitable configurations are possible besides that shown in FIG. 4.

It will be understood that the power conversion system may include one or more RC networks and one or more power converters, where the power converters and RC networks are connected in series across a line potential of the HV power supply.

According to a first example, a power conversion system may have a single RC network and a single power converter connected in series, where the RC network is connected to the ground connection of a single phase HV network and the power converter is connected to the line connection of the single phase HV network. Alternatively, the HV network may be a polyphase network. Alternatively, the HV network may be a polyphase network where the RC network is connected to the ground connection and phase converter is connected to one of the line connections.

According to a second example, a power conversion system may have a single RC network and a single power converter connected in series, where the RC network is connected to the line connection of a single phase HV network and the power converter is connected to the ground connection of the single phase HV network. Alternatively, the HV network may be a polyphase network where the RC network is connected to one of the line connections and phase converter is connected to the ground connection.

According to a third example, a power conversion system may have a single RC network and a single power converter connected in series, where the RC network is connected to a first line connection of a polyphase HV network and the power converter is connected to a second line connection of the polyphase HV network. That is, the RC network and phase converter are connected between two different phases of the HV network.

According to a fourth example, a power conversion system may have a single RC network and a first and second power converter connected in series either side of the RC network, where the first power converter is connected to a first line connection of a polyphase HV network and the second power converter is connected to a second line connection of the polyphase HV network. That is, the RC network and two phase converters are connected between two different phases of the HV network.

According to a fifth example, a power conversion system may have a single RC network and a first and second power converter connected in series either side of the RC network, where the first power converter is connected to a line connection of a single phase HV network and the second power converter is connected to a ground connection of the polyphase HV network.

Figure 5:
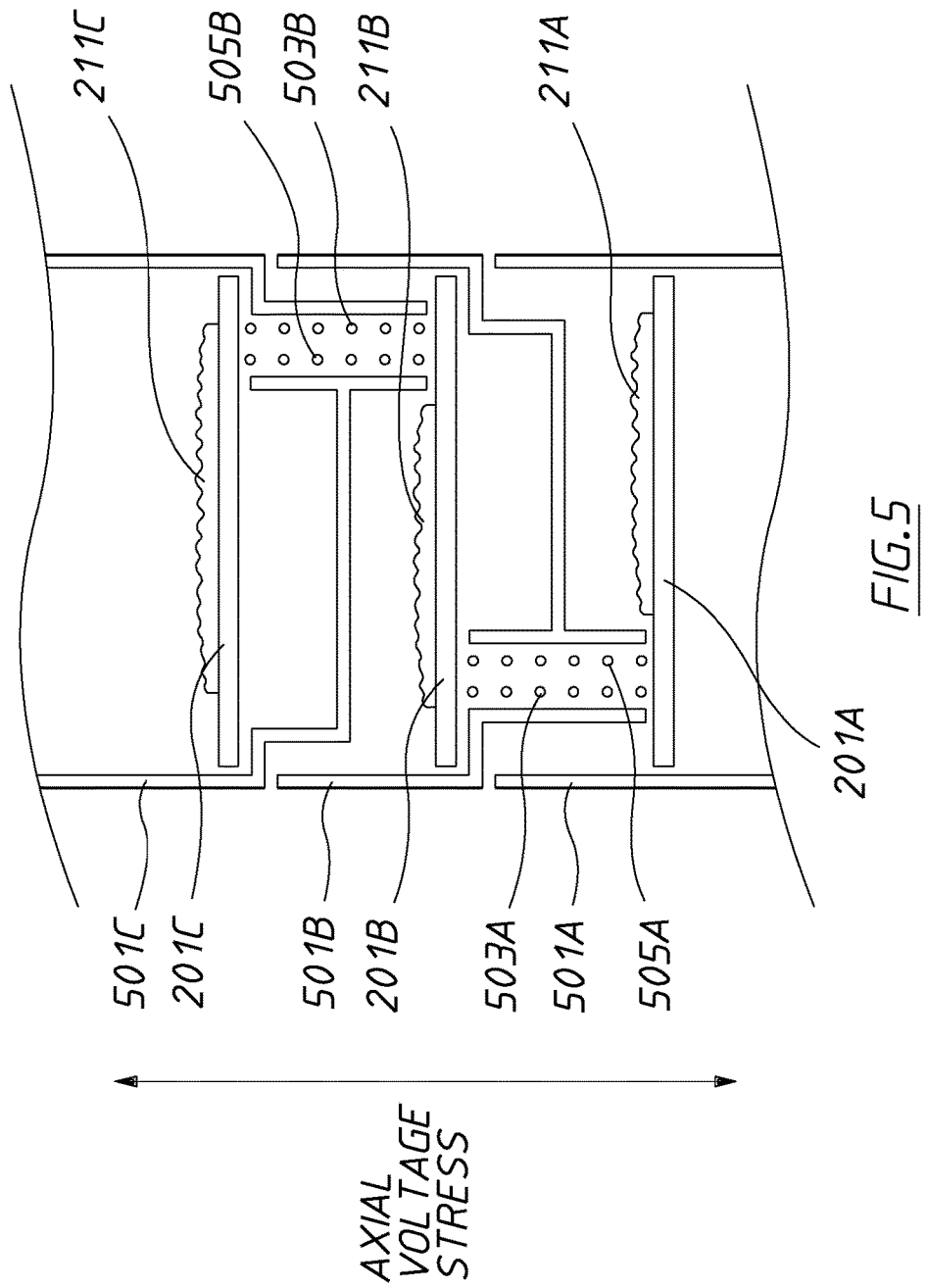
FIG. 5 shows a stack of electrically interconnected electronic circuit boards within insulating cups according to the present disclosure.

FIG. 5 shows a stack of electrically interconnected electronic circuit boards (wafers) within insulating cups (501 A, 501 B, 501 C). The insulating cups support the wafers (201 A, 201 B, 201 C) with the RC chain networks (211 A, 211 B, 211C) located thereon. Electrically conductive connecting springs (503A, 503B) electrically connect the wafers together and provide some flexibility to ease axial voltage stress. That is, the insulating cups have a channel (505A, 505B) formed therein to receive the springs (503A, 503B) where the channel extends between a lower surface of a first wafer to the upper surface of a second wafer. The insulating cups may be shaped to control the axial and transverse voltage stress associated with the wafer stack.

Therefore, the electrical power conversion system as described herein has one or more insulated circuit board receptacles that are arranged to support the one or more electronic circuit boards (wafers). Each of the insulated circuit board receptacles may be arranged to support one of a number of the electrically interconnected electronic circuit boards in a stacked configuration.

Figure 6:
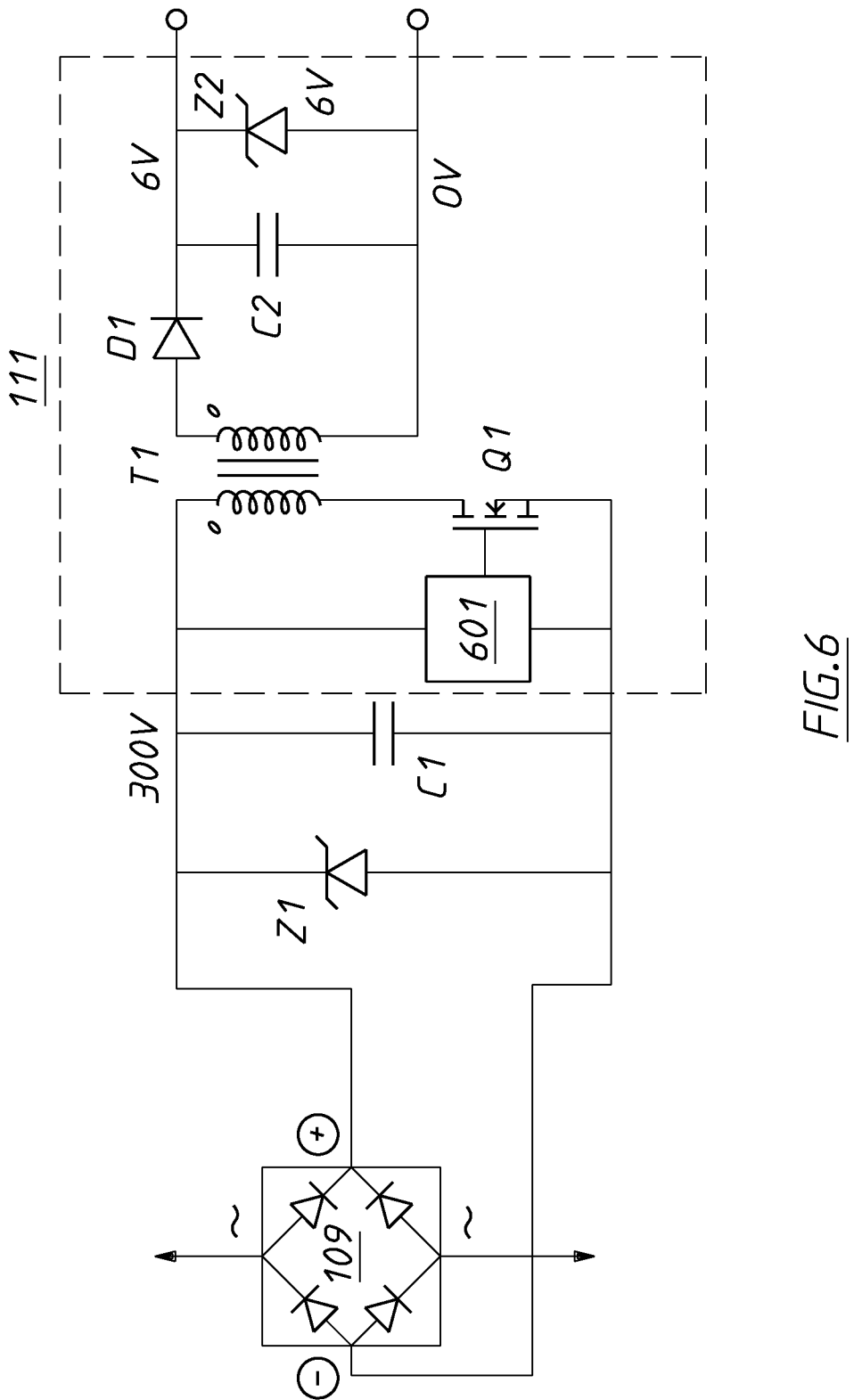
FIG. 6 shows a schematic diagram of a power converter according to the present disclosure.

FIG. 6 shows a schematic diagram of a power converter including a switching DC-DC power converter 111 (switch mode power supply). A control circuit 601 provides high frequency switching control of switching transistor Q1, which feeds power to the primary winding of a forward step-down transformer T1. The output of the secondary winding of T1 is rectified by diode D1 and feeds a reservoir capacitor C2. The Zener diode Z2 limits the output voltage to 6V. The output power generated by the switch mode power supply (SMPS) is provided to the load electronic system.

As can be seen the SMPS is operated with a high voltage in the order of 300V on the primary side and in conjunction with the RC chain solution as described herein. The SMPS converts from approximately 300V to the output voltage required by the load electronics.

FIG. 7 shows a schematic diagram of a voltage sense module 701. The current flowing through the RC chain network is essentially proportional to the phase-ground voltage of the HV network. This can be converted electronically into a suitable sense signal for the Fusesaver electronics by the line voltage sense module shown in FIG. 7. This therefore provides a system for monitoring the status of the phase-ground voltage.

In this circuit the RC chain current is converted to voltage by a resistor R100 in series with a capacitor C100. By selecting correct values for R100 and C100, the phase shift introduced by the RC chain network is corrected so that the voltage output of the voltage sense module is in phase with the line voltage signal of the HV network.

It will be understood that there are many other possible implementations to correct for the phase shift caused by the RC chain network including, for example, signal processing to derive the corrected signal.

Therefore, the electrical power conversion system has a voltage sense module that is adapted to measure a current flowing through the RC network and convert that current to a sensor voltage value for use by sensing electronics. Further, the voltage sense module is arranged to correct the phase shift caused by the RC network.

In order to overcome the inherent inaccuracy of the described method of voltage sensor measurement provided by the voltage sense module due to the power converter subtracting 300V from line voltage driving the current in the RC chain, a voltage loss correction module may be incorporated into the downstream electronics which is processing the signal from the voltage sense module to correct the sensor voltage value based on voltage losses caused by the power conversion system.

Without the voltage loss correction module, if the peak line voltage is below 300V no current will flow in the line voltage sense resistor. Also, at line voltages above 300V peak, the 300V would be subtracted from the instantaneous value measured by the voltage sense module.

To correct for the inaccuracy at voltages above the 300V threshold due to the power conversion system, 300V can be digitally added by the voltage loss correction module to each of the samples. For 1 ms sampling of a 6.3 kV signal this method reduces the measurement error from 4.5% to 0.02%. It will be understood that other methods of error correction are envisaged.

Control of electrical stress is critical to the long term reliability of insulating products. The herein described systems enable electrical stress to be predicted and well controlled as well as being relatively independent of manufacturing variations.

Electrical stresses on the resistive and capacitive components may be calculated under the various PF conditions to be withstood (such as phase/ground voltage, PF test) using commonplace electronic design practices. These values may be used to determine the number of components required to meet the component manufacturers rating, tolerance aspects etc.

Transverse electrical stress between elements of the RC network chain is controlled by the component layout (i.e. the configuration of the RC network) on the wafer PCB. The design requirement is to meet the appropriate surface electrical stress for the product environment and the PCB material. The determination of the appropriate stress and configuration results in the chain angle as shown in FIG. 2A.

Wafer axial stress is dependent on the voltage developed across each wafer and the wafer spacing. Finite element analysis can be used to calculate stresses and stress can be further controlled by use of a conformal coating (to reduce triple point stress), and interposing insulating elements. In this example, stacking cups may be used to assemble the wafer stack and to provide additional insulation as shown in FIG. 5.

Various advantages are provided for certain features as described herein as follows:

Use of an RC network to provide a power source from a power line of an HV network: This provides an advantage that current is limited at both PF and impulse conditions with the advantage of low power dissipation at normal voltages. Further, power can be supplied to either a grounded device, to a device floating at line potential or to both.

Use of SMPS to convert current to useable power with high frequency switching: This provides an advantage in that the cost and size of making a PF transformer is negated. Using a SMPS enables high efficiency, low cost, and small size conversion of the power from the RC network.

Use of multiple SMT components on circuit boards to make the RC network: This provides various advantages including, for example, the minimisation of costs, control of electrical stresses and the provision of graceful degradation for component failure.

Use of stacked wafer construction: This provides various advantages including, for example, controlling electrical stresses and allowing various rated voltages to be achieved using multiple sets of the same basic component parts.

Use of stacking cups: This provides various advantages including, for example, controlling electrical stresses and minimising costs.

Addition of voltage sensing network to provide voltage sensing from the current provided by the RC chain: This provides various advantages including, for example, enabling line voltage measurement.

Digital correction of distortion of voltage sensing due to power take off: This provides various advantages including, for example, improving accuracy from RC chain.

Although the example shown in FIG. 1 shows the RC network connected to the ground connection of the HV network, and the power converter connected to the line connection of the HV network (via the optional voltage sense module), as mentioned above it will be understood that, as an alternative, the RC network may be connected to the line connection of the HV network and the power converter 103 may be connected to the ground connection of the HV network. As a further alternative, as mentioned above, the RC network may be connected to a first line connection (i.e. a first phase of the three-phase HV network) and the power converter 103 may be connected to a second line connection (i.e. a second phase of the three-phase HV network.

It will be understood that, according to further alternatives, the power converter of the power conversion system may be located at i) the grounded end of the HV network to supply a grounded electronic system, ii) at the line end of the HV network to supply an electronic system floating at line potential, or iii) where there are multiple power converters, at both ends.

It will be understood that, according to a further alternative, the power converter module may be an AC-DC power converter module and that the power converter 103 does not require the rectifier 109, capacitor C1 and the Zener diode Z1.

As a further alternative, it will be understood that the power converter may be placed on a wafer in order to create a self-contained electrical power conversion system which may then be connected directly to the HV network. Further, the voltage sense module may be located on the power converter wafer to condition the current flowing in the RC network chain into a signal for the load electronics to measure the line-ground voltage, as discussed in more detail herein.

According to the above described example, there are an equal number of resistors and capacitors in the series RC chain. However, it will be understood that, as an alternative, there may be more resistors than capacitors, or more capacitors than resistors.

It will be understood that, as an alternative, there may be more than one series RC network. For example, multiple series RC networks may be connected between HV electrical power supply and the power converter either in series or in parallel (e.g. to provide a level of redundancy).

It will be understood that, as an alternative, there are many integrated circuits that are available to perform the function of the SMPS. Further, it would be understood that there are many possible circuit topologies such as, for example, forward or fly back, isolated or nonisolated etc.

The arrangements described are applicable to the power supply industries.

The foregoing describes only some embodiments of the present invention, and modifications and/or changes can be made thereto without departing from the scope and spirit of the invention, the embodiments being illustrative and not restrictive.

In the context of this specification, the word "comprising" means "including principally but not necessarily solely" or "having" or "including", and not "consisting only of". Variations of the word "comprising", such as "comprise" and "comprises" have correspondingly varied meanings.

The invention claimed is:

1. An electrical power conversion system for converting a high voltage (HV) from a HV electrical power supply to a low voltage, the electrical power conversion system comprising:
   at least one power converter; and
   at least one RC network including a plurality of resistive components and a plurality of capacitive components electrically connected in series, wherein the at least one RC network is in series connection with the at least one power converter, and the at least one RC network and at least one power converter are arranged to be connected across a line potential of the HV electrical power supply, wherein the at least one power converter includes a rectifier to rectify a current flowing through the at least one RC network.

2. The electrical power conversion system of claim 1, wherein the at least one power converter includes a switch mode power supply.

3. The electrical power conversion system of claim 1, wherein:
   the plurality of resistive components are a plurality of surface mounted resistive components and the plurality of capacitive components are a plurality of surface mounted capacitive components; and the plurality of surface mounted resistive components and the plurality of surface mounted capacitive components are mounted on one or more electronic circuit boards forming the at least one RC network on the one or more electronic circuit boards.

4. The electrical power conversion system of claim 3, further comprising:
a plurality of RC networks, the plurality of RC networks including the at least one RC network, wherein
the plurality of surface mounted resistive components and the plurality of surface mounted capacitive components are mounted on a plurality of electronic circuit boards respectively forming the plurality of RC networks with one respective RC network on each respective electronic circuit board of the plurality of electronic circuit boards, and
the plurality of electronic circuit boards are stacked and electrically interconnected forming a stacked RC network including the electrically interconnected plurality of electronic circuit boards.

5. The electrical power conversion system of claim 4, wherein the at least one power converter is mounted on a further electronic circuit board, and the further electronic circuit board forms part of the plurality of electronic circuit boards that are stacked.

6. The electrical power conversion system of claim 4, further comprising:
one or more insulated circuit board receptacles arranged to support the one or more electronic circuit boards.

7. The electrical power conversion system of claim 6, wherein the one or more insulated circuit board receptacles includes a plurality of insulated circuit board receptacles, each arranged to support a respective one of a plurality of the electrically interconnected electronic circuit boards in a stacked configuration.

8. The electrical power conversion system of claim 1, further comprising:
a voltage sense module adapted to measure the current flowing through the at least one RC network and adapted to convert the current to a sensor voltage value.

9. The electrical power conversion system of claim 8, further comprising:
a voltage loss correction module, wherein the voltage loss correction module is adapted to correct the sensor voltage value based on voltage losses caused by the at least one power converter.

10. The electrical power conversion system of claim 1, wherein the at least one RC network and at least one power converter are arranged to be connected between a line connection of the HV electrical power supply and a ground connection of the HV electrical supply.

11. The electrical power conversion system of claim 1, wherein the at least one RC network and at least one power converter are arranged to be connected between a first line connection of the HV electrical power supply and a second line connection of the HV electrical supply.

12. The electrical power conversion system of claim 4, further comprising:
one or more insulated circuit board receptacles arranged to support the one or more electronic circuit boards.

13. The electrical power conversion system of claim 12, wherein the one or more insulated circuit board receptacles includes a plurality of insulated circuit board receptacles, each arranged to support a respective one of the plurality of the electrically interconnected electronic circuit boards in a stacked configuration.

14. The electrical power conversion system of claim 2, further comprising:
a voltage sense module adapted to measure the current flowing through the at least one RC network and adapted to convert the current to a sensor voltage value.

15. The electrical power conversion system of claim 14, further comprising:
a voltage loss correction module, wherein the voltage loss correction module is adapted to correct the sensor voltage value based on voltage losses caused by the at least one power converter.

16. The electrical power conversion system of claim 3, further comprising:
a voltage sense module adapted to measure the current flowing through the at least one RC network and adapted to convert the current to a sensor voltage value.

17. The electrical power conversion system of claim 16, further comprising:
a voltage loss correction module, wherein the voltage loss correction module is adapted to correct the sensor voltage value based on voltage losses caused by the at least one power converter.

18. The electrical power conversion system of claim 3, further comprising:
one or more insulated circuit board receptacles arranged to support the one or more electronic circuit boards.

* * * * *